United States Patent
Nagode et al.

(10) Patent No.: US 7,079,819 B2
(45) Date of Patent: Jul. 18, 2006

(54) RF TRANSMITTERS WITH SATURATION DETECTION AND CORRECTION AND METHODS THEREFOR

(75) Inventors: Thomas Nagode, Vernon Hills, IL (US); Patrick Pratt, Cork (IE); Dale Schwent, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 351 days.

(21) Appl. No.: 10/805,862

(22) Filed: Mar. 22, 2004

(65) Prior Publication Data

US 2004/0176049 A1    Sep. 9, 2004

Related U.S. Application Data

(62) Division of application No. 10/097,714, filed on Mar. 13, 2002, now Pat. No. 6,741,840.

(51) Int. Cl.
*H01Q 11/12*   (2006.01)
*H04B 1/04*   (2006.01)

(52) U.S. Cl. .................. 455/126; 455/63.1; 455/91; 455/123; 455/127.1; 455/127.2; 330/149

(58) Field of Classification Search ........... 455/126, 455/69, 127.1, 127.2, 91, 115.1, 115.2, 120, 455/123–125, 108, 75, 504, 67.11, 67.13, 455/63.1, 63.3; 327/1, 297; 330/129, 136, 330/149; 375/296–297
See application file for complete search history.

(56) References Cited

U.S. PATENT DOCUMENTS

| | | | | |
|---|---|---|---|---|
| 5,163,159 | A * | 11/1992 | Rich et al. ................... 455/74 |
| 5,287,555 | A * | 2/1994 | Wilson et al. ............ 455/115.1 |
| 5,448,203 | A * | 9/1995 | Matui et al. ................. 330/149 |
| 5,553,318 | A * | 9/1996 | Ohmagari et al. .......... 455/126 |
| 5,659,893 | A * | 8/1997 | Enoki et al. ................. 455/126 |
| 5,697,074 | A * | 12/1997 | Makikallio et al. ......... 455/126 |
| 5,748,677 | A * | 5/1998 | Kumar ........................ 375/285 |
| 5,826,177 | A * | 10/1998 | Uno ............................. 455/126 |
| 6,281,935 | B1 * | 8/2001 | Twitchell et al. ........... 348/470 |
| 6,321,072 | B1 * | 11/2001 | Cipriani et al. ............. 455/126 |
| 6,515,543 | B1 * | 2/2003 | Weber ......................... 330/149 |
| 6,553,213 | B1 * | 4/2003 | Kikuchi ....................... 330/129 |
| 6,690,232 | B1 * | 2/2004 | Ueno et al. ................... 330/85 |
| 2002/0168025 | A1 * | 11/2002 | Schwent et al. ............. 375/297 |

* cited by examiner

*Primary Examiner*—Pablo N. Tran
(74) *Attorney, Agent, or Firm*—Roland K. Bowler, II

(57) ABSTRACT

Methods in radio communications devices having a transmitter with an integral control loop, and in other integral control systems, including generating a first error signal (210) based upon an amplifier output signal and a corrected reference signal, generating a second error (220) signal based on a closed loop integral control signal applied to a control input of the amplifier and based on an integral control reference signal, and generating the corrected reference signal (230) by correcting a reference signal based upon the first and second error signals.

8 Claims, 3 Drawing Sheets

| AOC_MAX_sig | SAT_DET | ACCM_CLK | SAT_REG_CLK |
|---|---|---|---|
| FALSE | FALSE | ACTIVE | INHIBITED |
| FALSE | TRUE | INHIBITED | ACTIVE |
| TRUE | FALSE | ACTIVE | ACTIVE |
| TRUE | TRUE | INHIBITED | ACTIVE |

RF TRANSMITTERS WITH SATURATION DETECTION AND CORRECTION AND METHODS THEREFOR

CROSS REFERENCE TO RELATED APPLICATIONS

The present application is a division of U.S. application Ser. No. 10/097,714, filed on 13 Mar. 2002, now U.S. Pat. No. 6,741,840 having a common inventorship and assignee, from which benefits under 35 U.S.C. 120 are hereby claimed, the contents of which are fully incorporated herein by reference.

FIELD OF THE INVENTIONS

The present inventions relate generally to radio frequency transmitters with integral control, and more particularly to saturation detection and correction in transmitters, for example TDMA transmitters in mobile radio communication devices, and methods therefor.

BACKGROUND OF THE INVENTIONS

U.S. Pat. No. 4,458,209 entitled "Adaptive Power Control Circuit", assigned commonly with the present application, discloses a dual band analog control loop having an integrator with a variable response time provided by switching first and second resistors of an RC time constant. The faster time constant applies to transient operation and the slower time constant to steady-state operation. See also, U.S. Pat. No. 5,697,074 entitled "Dual Rate Power Control Loop For a Transmitter".

In digital control circuits, the peak detect circuit output is filtered and converted to a digital format before being input to a processor, which provides an output control signal based on a comparison of the digitized input signal with a reference signal. Like the analog control circuits discussed above, digital control circuits control the amplifier in a manner that tends to match the digitized peak-detect circuit signal with the reference signal. See for example, U.S. Pat. No. 5,287,555 entitled "Power Control Circuitry for A TDMA Radio Frequency Transmitter".

In GSM and other time division multiple access (TDMA) based cellular radio communication devices, a closed loop digital integral control system sets the RF power level and controls the turn-on on turn-off response of the transmitter, which operates in a burst mode. In these radio communication applications, it is important to maintain power control throughout transmission in order to comply with telecommunication standards specifications. For example, the transmitter must ramp-up and ramp-down in a manner prescribed by the telecommunications standards to minimize spectral splatter.

In the exemplary radio communications application, when the transmitter output power becomes saturated, the integral control loop loses lock and the control signal grows excessively resulting in an uncontrolled open loop, a phenomenon known as integral windup. Under these uncontrolled open loop conditions, when the transmitter is required to ramp-down after a delay dependent upon the degree of the preceding integral windup, the control line goes low rapidly and the control loop attempts to re-lock, resulting in severe transients and spectral splatter. Another adverse result of the uncontrolled, open loop condition is the inability of the transmitter to turn off within the time interval specified by the telecommunications standards. The integral windup phenomenon is also prevalent in other closed loop integral control systems.

The various aspects, features and advantages of the present invention will become more fully apparent to those having ordinary skill in the art upon careful consideration of the following Detailed Description of the Invention with the accompanying drawings described below.

DETAILED DESCRIPTION OF THE INVENTIONS

Figure 1:
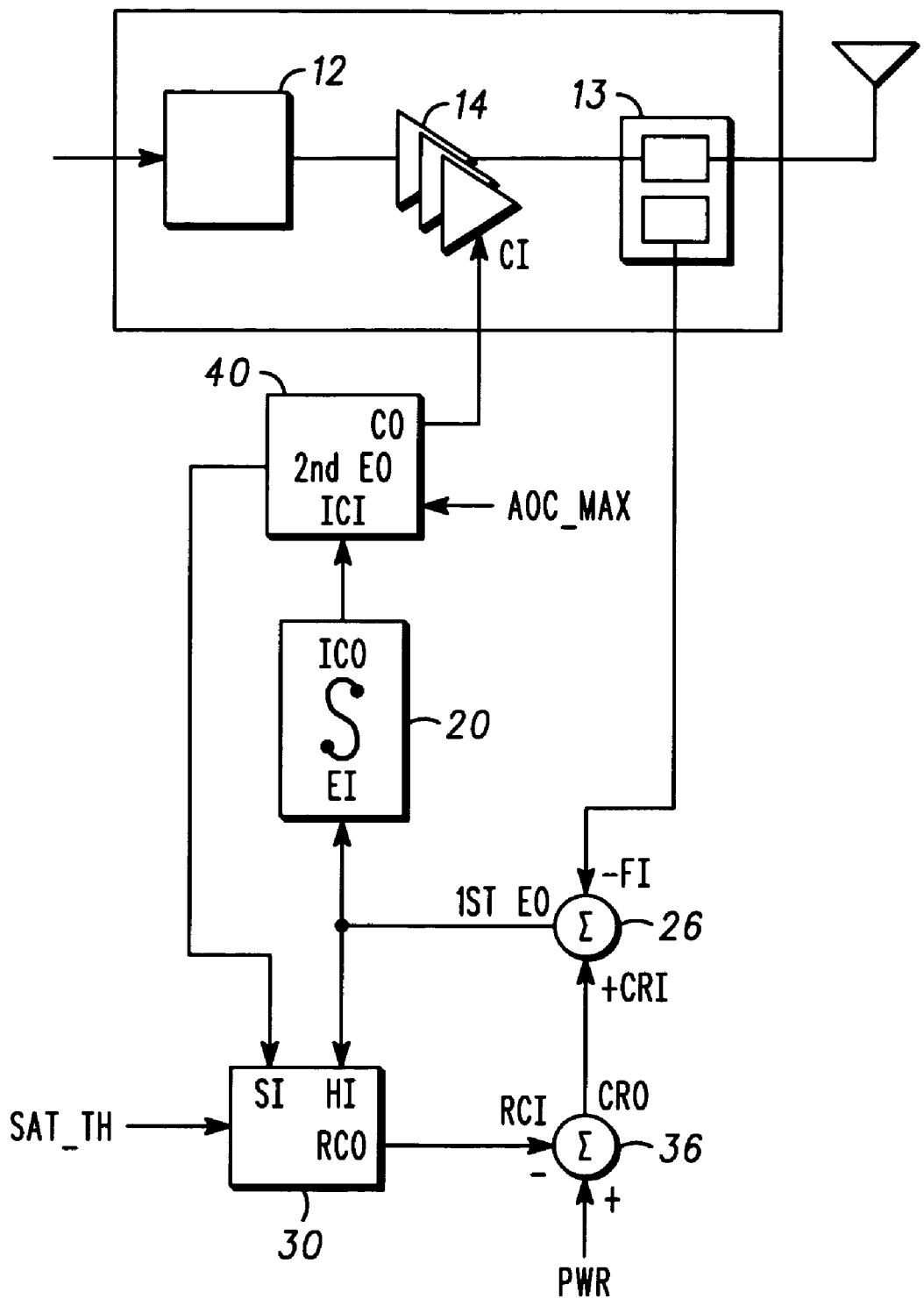
FIG. 1 is an exemplary closed loop integral control radio communications transmitter.

FIG. 1 is a radio communications transmitter 10, for example a time division multiple access (TDMA) transmitter, with closed loop integral control. The exemplary transmitter comprises generally a Cartesian or polar vector modulator 12 with an output coupled to an input of an amplifier 14, which typically comprises multiple, cascaded amplifiers, as illustrated.

The closed integral control loop includes a peak-detector 13 at the transmitter output for detecting an output signal that is compared or summed with a reference signal to produce a first error signal used by an integral control device 20 for controlling the transmitter, and particularly the amplifier thereof. Generation of the first error signal is illustrated in the process flow diagram of FIG. 2, at block 210.

In FIG. 1, an error signal circuit 26 produces the first error signal at a first error output ($1^{st}$ EO) thereof by summing a difference, or subtracting, an output of the peak-detector 13, applied to the error signal circuit 26, from a corrected reference signal applied to a corrected error input (CRI) of the error signal circuit 26. The first error signal of the error signal circuit 26 is applied to an error input (EI) of the integral control device 20.

In FIG. 1, the integral control device 20 has an integral control output (ICO) coupled either directly or indirectly to a control input (CI) of the amplifier 14. In operation, the integral control device 20 tends to match the transmitter output, as measured by the peak-detector 13, with the corrected reference signal applied to the error signal circuit 26 by applying an appropriate closed loop integral control signal, which is based upon the first error signal of the error signal circuit 26, to the control input of the amplifier.

The exemplary transmitter may be implemented with analog or digital circuitry. In a digital implementation, the peak detect circuit 13 output is filtered and converted to a digital format before being input to a digital integral control device, which may be implemented with clocked accumulator and register for providing the output control signal based the first error signal.

The details of digital and analog implementations of closed loop integral control circuits for radio communications transmitters are beyond the scope of the instant patent application and will be discussed only as required to practice the inventions disclosed herein. An exemplary digital TDMA transmitter is disclosed in U.S. Pat. No. 5,287,555 entitled "Power Control Circuitry for A TDMA Radio Frequency Transmitter", the subject matter of which is incorporated herein by reference.

The integral control loop saturation detection and correction implementations of the present inventions, which are discussed more fully below, are applicable more generally to closed loop systems other than the exemplary radio transmitter applications disclosed herein, including for example, applications in cruise, guidance and climate control environments, among many others. Also, the integral control device may be of a more general nature, including for example those with proportional, integral and derivative actions, also known as PID controllers. These and other closed loop control systems with integral control devices are ubiquitous and will benefit as well from the saturation detection and correction inventions disclosed herein.

Figure 2:
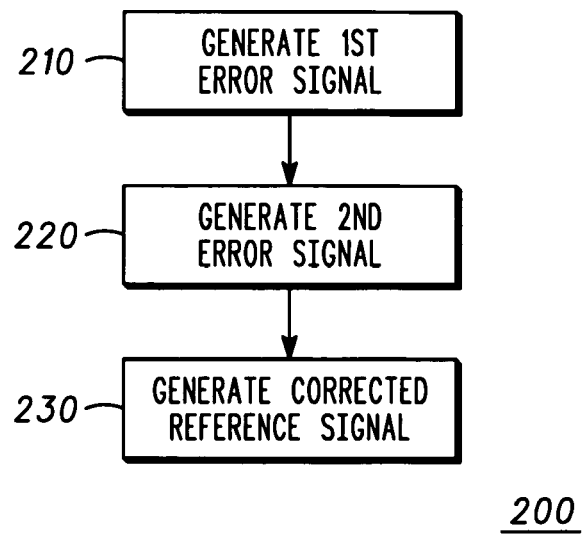
FIG. 2 is an exemplary process flow diagram for an exemplary embodiment of the invention.

In FIG. 2, in one embodiment, a second error signal is generated at block 220 based upon the closed loop integral control signal applied by the integral control device 20 to the control input of the amplifier or some other controlled device, and based upon an integral control reference signal.

In FIG. 1, the second error signal is generated by integral control device controller 40 that compares the closed loop integral control signal, applied to the integral control input (ICI) thereof by the integral control device 20, with the integral control reference signal applied to a limit reference input (AOC_MAX) of the integral control device controller 40.

In one mode of operation, the second error signal is produced by the integral control device controller 40 only when the closed loop integral control signal is greater than the integral control reference signal applied to a limit reference input (AOC_MAX) of the integral control device controller 40.

In one embodiment, the integral control device controller 40 includes a control output (CO) coupled to the amplifier control input (CI), or more generally to the control input of some other controlled device. The integral control device controller 40 limits the closed loop integral control signal applied to the controlled device, the amplifier in the exemplary embodiment, when the closed loop integral control signal produced by the integral control device 20 exceeds the integral control reference signal applied to the limit reference input (AOC_MAX) of the integral control device controller 40. In other alternative embodiments, without integral control signal limiting, the integral control output of the integral control device 20 is coupled directly to the control input of the amplifier or other controlled device. The configuration for limiting the integral control signal applied to the controlled device is preferred for the exemplary radio transmitter application since the transmitter may operate outside the communications standard specification without the limiting control.

In FIG. 1, a reference signal control circuit 30 comprises a first input (HI) coupled to the first error output ($1^{st}$ EO) of the error signal circuit 26 and a second input (SI) coupled to the second an error output ($2^{nd}$ EO) of the integral control device controller 40. The reference signal control circuit 30 also comprises a reference control output (RCO) coupled to a reference control input (RCI) of a reference signal correction circuit 36 having a reference input (PWR). The reference signal correction circuit 36 also has a corrected reference output (CRO) coupled to the corrected reference input (CRI) of the error signal circuit 26.

In FIG. 2, at block 230, the corrected reference signal is generated by correcting a reference signal based upon the first and second error signals. In FIG. 1, for example, the reference signal correction circuit 36 sums or computes a difference between the reference control signal from the reference signal control circuit 30 and a reference signal provided to the reference input (PWR) of the reference signal correction circuit 36. The corrected reference signal is applied to the error signal circuit 26.

The reference control signal of the reference signal control circuit 30 is proportional generally to the first error signal produced by the error signal circuit 26. In one mode of operation, the reference signal input to the reference signal correction circuit 36 is corrected by subtracting therefrom an amount approximately equal to the first error signal. This correction scheme works particularly well in systems where the controlled device, the transmitter in the exemplary embodiment, has relatively constant gain.

In another mode of operation, the reference signal is corrected by subtracting therefrom an amount greater than the first error signal, for example "[Error 1+Step]", where the "Step" term is determined empirically for the particular control system under consideration. This alternative scheme is useful for TDMA transmitters applications where the transmitter output tends to decrease during bursts. In this and other applications, the "Step" is selected to ensure that the transmitter remains unsaturated throughout the burst.

In yet another mode of operation, the reference signal is corrected by subtracting therefrom an amount less than the first error signal, for example" [(Error 1/DIV)+step], where the "DIV" and "step" terms are determined empirically for the particular control system under consideration.

In one embodiment, in FIG. 1, the reference control signal is applied by the reference signal control circuit 30 to the reference signal correction circuit 36 only when the integral control signal of the integral control device 20 exceeds the integral control reference signal of the integral control device controller 40, for example based upon the presence of the second error signal at the input (SI) of the reference signal control circuit 30.

In another embodiment of the invention, the reference signal (PWR) is corrected based upon the first error signal, without regard for the second error signal, for example if the first error signal exceeds a saturation threshold (SAT_TH). In FIG. 1, the saturation threshold signal (SAT_TH) is input to the reference signal control circuit 30 and a comparison is made between the saturation threshold signal and the first error signal for this purpose.

In operation, when the first error signal of the error signal circuit 26 exceeds the saturation threshold, the corrected reference signal applied to the corrected reference signal input (CRI) of the error signal circuit 26 is generated by subtracting the first error signal, or some variation thereof, from the reference signal (PWR) at the reference signal correction circuit 36. In one mode of operation, the reference signal (PWR) input to the reference signal correction circuit 36 is corrected by subtracting therefrom an amount approximately equal to the first error signal, as discussed above. In other modes of operation, the reference signal is corrected by subtracting therefrom an amount that is more than or less than the first error signal, as discussed above. As discussed above, for TDMA transmitter applications where the transmitter output decreases during the course of the burst, it is desirable to reduce the reference signal by an amount, greater than the first error signal, sufficient to keep the transmitter out of saturation throughout the burst.

Integral windup of the integral control device may be controlled based upon the integral control reference signal applied to the limit reference input (AOC_MAX) of the integral control device controller 40 alone or in combination with the saturation reference signal (SAT_TH) applied to the reference signal control circuit 30.

Integral windup control based upon the saturation threshold signal (SAT_TH) of the reference signal control circuit 30 is coarse in comparison to control based upon the integral control reference signal (AOC_MAX) of the integral control device controller 40. Integral windup control based on the integral control reference signal applied to the limit reference input (AOC_MAX) of the integral control device controller 40 provides relatively precise control when the control system operates within the saturation threshold, but when the integral control signal exceeds the integral control reference signal (AOC_MAX).

In one embodiment, the integral control reference signal limit, input at the AOC_MAX input of the integral control device controller 40, is reduced at least temporarily when the first error signal exceeds the saturation threshold (SAT_TH). In applications where the transmitter operates in a burst transmission mode, for example in GSM and other TDMA based communications transmitter applications, the integral control reference signal (AOC_MAX) is maintained at the reduced limit until the end of a transmission burst during which the limit was reduced. Thereafter, the integral control reference signal limit is changed back to a default value upon completion of the transmission burst during which the limit was reduced.

In implementations where the integral control device comprises clocked accumulator and register circuits, in some applications, the clock of the integral control device is inhibited when the first error signal exceeds the saturation threshold (SA_TH). The inhibition of the clock prevents continued windup of the accumulator and/or register during saturation, thus eliminating the requirement or resetting the accumulator and register and any attending delay associated therewith.

Figure 3:
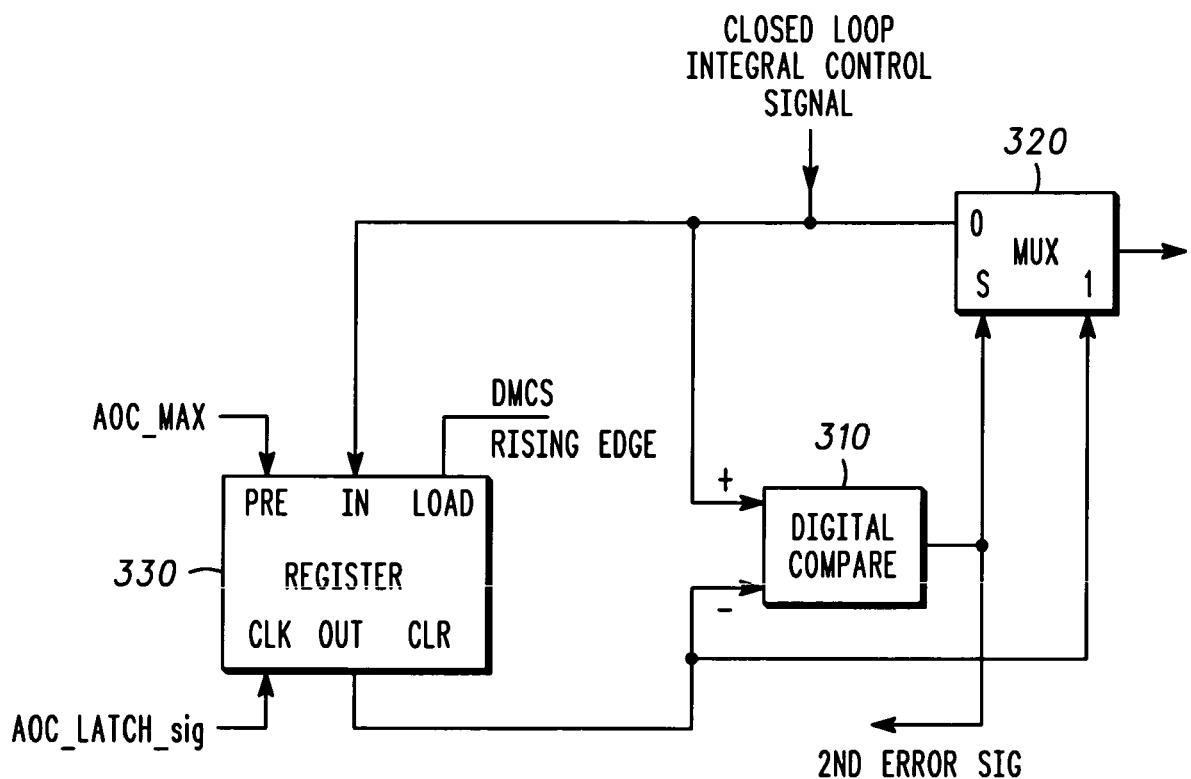
FIG. 3 is an exemplary digital implementation of a portion of a saturation detection and correction circuit.

FIG. 3 is portion of an exemplary digital soft saturation detection implementation that determines whether the closed loop integral control signal of the integral control device 20 has exceeded an integral control reference (AOC_MAX) in a TDMA transmitter application. The closed loop integral control signal is compared with the integral control reference signal (AOC_MAX) at a comparator 310, the output of which is the second error signal (2nd ERROR_sig), which is clocked into a multiplexer 320 that provides an output to the control input of the amplifier. The integral control reference signal (AOC_MAX) is provided to the comparator 310 by a clocked register 330.

In FIG. 3, the second error signal ($2^{nd}$ ERROR_sig) is input to a logic block 410, which also has input thereto a SAT_DET output from a comparator 420. The saturation detection output (SAT_DET) is enabled when the first error signal exceeds the saturation threshold (SAT_TH). The first error signal ($1^{st}$ ERROR_sig) is compared to the saturation reference (SAT_TH) at the comparator 420. In some embodiments, as noted above, the first error signal is increased by an incremental "Step" term at a summer 430, the output of which is input to a register 440 by a summer 450 having an input coupled to the register output.

Figures 4, 5:
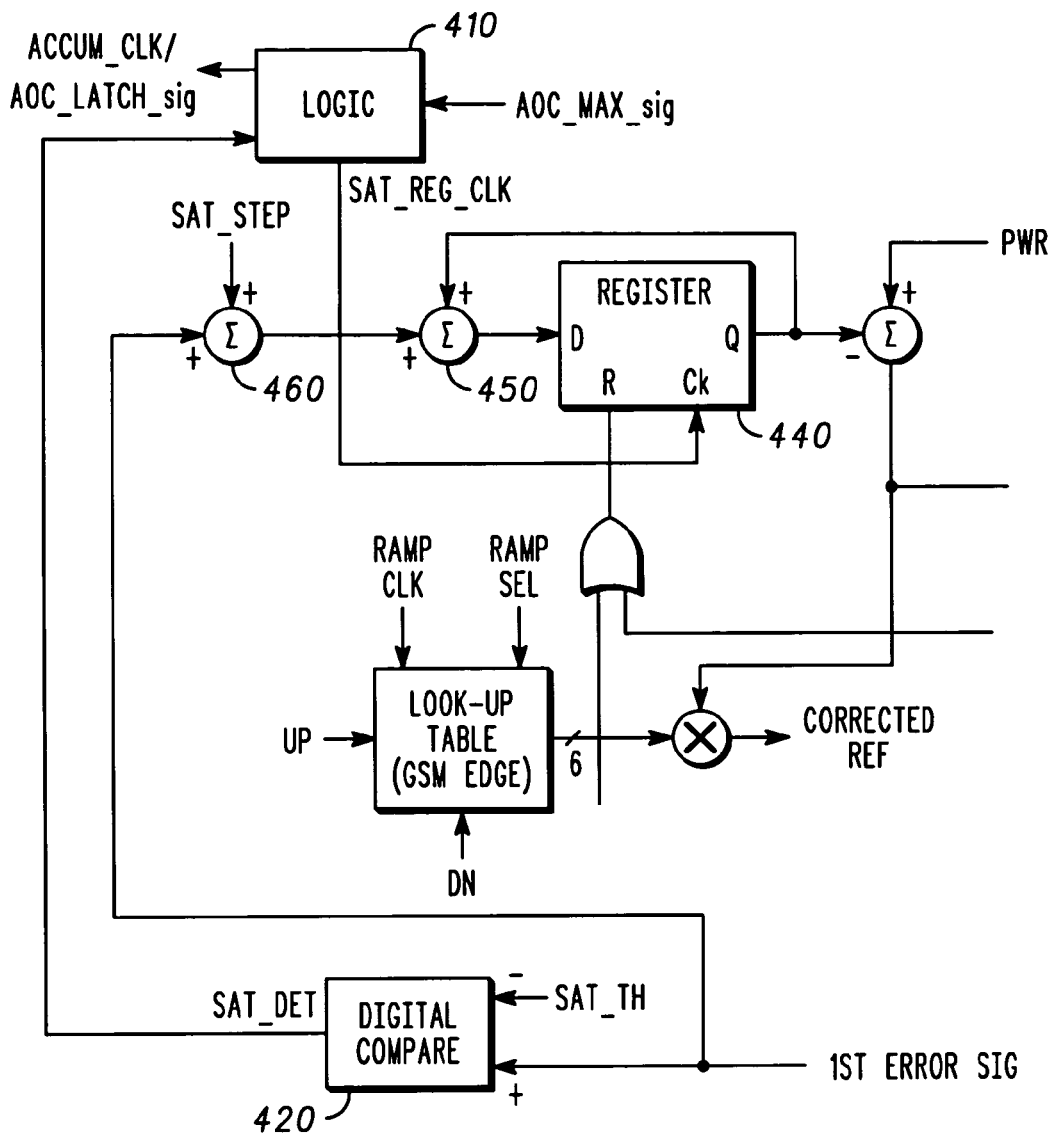
FIG. 4 is an exemplary digital implementation of another portion of the saturation detection and correction circuit.
FIG. 5 is an exemplary logic block truth table.

The logic block 410 has a first output (SAT_REG_CLK) to the clock input (Ck) of the register 440. The logic block 410 has a second output (ACCM_CLK), which may also be considered a clock signal, to the accumulator of an integral control device. FIG. 5 is a logical look-up table for the operation of the logic block 410. When the clocks (SAT_REG_CLK & ACCM_CLK) are active, their respective registers can update based on the register input values. When the clocks are inhibited, the registers hold at their current values.

In TDMA transmitter applications, saturation is monitored at the end of ramp-up. Hard saturation is detected when the first error signal, at the output of the error signal circuit 26, exceeds an unacceptable positive value as set by the saturation threshold (SAT_TH). Soft saturation is detected when the integral control device accumulator value exceeds an unacceptable maximum value set by the integral control reference (AOC_MAX), which may be changed dynamically as discussed above. In FIG. 4, when hard or soft saturation is detected, the reference signal is reduce by a value of the error signal plus an addition offset as determined by SAT_STEP at summer 460. The referenced back-off occurs before the next measured RF power sample is obtained. In one embodiment, when hard saturation occurs, the integral control reference (AOC_MAX) is updated with current accumulator value, and upon completion of the burst the integral control reference (AOC_MAX) is reset to a default value.

While the present inventions and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the inventions, which are to be limited not by the exemplary embodiments but by the appended claims.

What is claimed is:

1. A radio communications device, comprising:
   a transmitter having a modulator with an output coupled to an input of an amplifier;
   an integral control device having an integral control output coupled to a control input of the amplifier;
   an error signal circuit having a feedback input coupled to an output of the amplifier, the error signal circuit having a corrected reference input and an error output coupled to an error input of the integral control device;
   an integral control device controller having an input coupled to the integral control output of the integral control device, the integral control device controller having a controlled output coupled to the amplifier control input, the integral control device controller having a limit reference input;
   a reference signal control circuit having a first input coupled to the first error output of the error signal circuit, an error output of the integral control device controller coupled a second reference control input of the reference signal control circuit;
   a reference signal correction circuit having a reference input,
   a reference control output of the reference signal control circuit coupled to a reference control input of the reference signal correction circuit.

2. The radio communications device of claim 1, the reference signal control circuit having a threshold input.

3. The radio communications device of claim 2, the reference signal control circuit for providing a corrected reference signal to the reference signal correction circuit if an error signal of the error signal circuit exceeds a saturation threshold of the reference signal control circuit.

4. The radio communications device of claim 1, the reference signal control circuit and the reference signal correction circuit for adjusting a corrected reference signal to the error signal circuit by an amount approximately equal to an error signal of the error signal circuit.

5. The radio communications device of claim 1, the reference signal control circuit and the reference signal correction circuit for adjusting a corrected reference signal to the error signal circuit by an amount greater than an error signal of the error signal circuit.

6. The radio communications device of claim 1, the reference signal control circuit and the reference signal correction circuit for adjusting a corrected reference signal to the error signal circuit by an amount less than an error signal of the error signal circuit.

7. The radio communications device of claim 1, the integral control device controller for limiting a control signal input to the amplifier based on a limit reference input of the integral control device controller.

8. The radio communications device of claim 1, the transmitter has a digital control loop, the reference signal control circuit and the reference signal correction circuit for adjusting a corrected reference signal to the error signal circuit based upon an error signal of the integral control device controller and an error signal the error signal circuit.

* * * * *